US012581904B2

(12) United States Patent (10) Patent No.: US 12,581,904 B2
Misaki et al. (45) Date of Patent: Mar. 17, 2026

(54) COOLING PLATE AND MEMBER FOR SEMICONDUCTOR MANUFACTURING APPARATUS

(71) Applicant: NGK Insulators, Ltd., Nagoya City (JP)

(72) Inventors: Masato Misaki, Handa City (JP); Koichi Yoshino, Nagoya City (JP); Akiyoshi Hattori, Nagoya City (JP); Kazuhiro Nobori, Handa City (JP)

(73) Assignee: NGK INSULATORS, LTD., Nagoya (JP)

( * ) Notice: Subject to any disclaimer, the term of this patent is extended or adjusted under 35 U.S.C. 154(b) by 527 days.

(21) Appl. No.: 18/173,208

(22) Filed: Feb. 23, 2023

(65) Prior Publication Data

US 2023/0386882 A1 Nov. 30, 2023

Related U.S. Application Data

(63) Continuation of application No. PCT/JP2022/021267, filed on May 24, 2022.

(51) Int. Cl.
H01L 21/683 (2006.01)
(52) U.S. Cl.
CPC ................................. H01L 21/6833 (2013.01)
(58) Field of Classification Search
None
See application file for complete search history.

(56) References Cited

U.S. PATENT DOCUMENTS

| | | | |
|---|---|---|---|
| 2005/0030823 A1 | 2/2005 | Tsuyuno et al. | |
| 2005/0101082 A1 | 5/2005 | Yokoyama et al. | |
| 2006/0169688 A1 | 8/2006 | Mori et al. | |
| 2015/0036261 A1 | 2/2015 | Jindo et al. | |
| 2015/0077895 A1 | 3/2015 | Jindo et al. | |
| 2021/0230074 A1* | 7/2021 | Nagai | C04B 35/62635 |

FOREIGN PATENT DOCUMENTS

| | | |
|---|---|---|
| JP | 2005-056944 A | 3/2005 |
| JP | 2005-154832 A | 6/2005 |
| JP | 2006-196864 A | 7/2006 |
| JP | 5666748 B1 | 2/2015 |
| JP | 2021-116218 A | 8/2021 |
| WO | 2014/141974 A1 | 9/2014 |
| WO | 2014/156543 A1 | 10/2014 |

OTHER PUBLICATIONS

English translation of the International Preliminary Report on Patentability (Chapter I) dated Dec. 5, 2024 (Application No. PCT/JP2022/021267).

* cited by examiner

*Primary Examiner* — Jeffrey D Washville
(74) *Attorney, Agent, or Firm* — BURR PATENT LAW, PLLC

(57) ABSTRACT

A cooling plate according to the present invention contains 42% to 65% by mass of $TiSi_2$, 4% to 16% by mass of TiC, and a smaller amount of SiC than the mass percentage of $TiSi_2$.

8 Claims, 8 Drawing Sheets

COOLING PLATE AND MEMBER FOR SEMICONDUCTOR MANUFACTURING APPARATUS

BACKGROUND OF THE INVENTION

1. Field of the Invention

The present invention relates to a cooling plate and a member for a semiconductor manufacturing apparatus.

2. Description of the Related Art

An electrostatic chuck is heated to high temperatures in a semiconductor process and has a cooling plate for heat dissipation. In this case, the electrostatic chuck may be made of alumina, and the cooling plate may be made of a composite material. The composite material is known to be a composite material containing silicon carbide, titanium silicide, titanium silicon carbide, or titanium carbide, for example, as disclosed in Patent Literature 1. Such a composite material has good material properties.

CITATION LIST

Patent Literature

PTL 1: JP 5666748 B

SUMMARY OF THE INVENTION

However, a cooling plate made of a composite material disclosed in Patent Literature 1 sometimes has a pit (small hole) on its surface. Such a pit may undesirably become a starting point of breakage or cause temperature variations on the surface and reduce the temperature uniformity of the surface.

The present invention has been made to solve such problems and primarily aims to provide a cooling plate with good material properties and with fewer pits on its surface.

[1] A cooling plate according to the present invention contains 42% to 65% by mass of $TiSi_2$; 4% to 16% by mass of TiC; and a smaller amount of SiC than the mass percentage of $TiSi_2$.

This cooling plate has good material properties and therefore has a high ability to cool an object. Furthermore, the cooling plate has fewer pits on its surface, can reduce the occurrence of breakage starting from a pit, and can reduce the occurrence of temperature variations due to a decrease in heat conduction around a pit.

It should be noted that a numerical range "a to b" means a or more and b or less.

[2] In a cooling plate according to the present invention (the cooling plate according to [1]), preferably, the cooling plate has a surface of 30,000 $mm^2$ or more, and when observed after a penetrant test using a fluorescent liquid on the surface, the surface has not more than one hole into which the fluorescent liquid has penetrated and that has a major axis of 0.5 mm or more. Such a hole is defined as a pit. Such a cooling plate has very few pits, which can further reduce the occurrence of breakage starting from a pit and the occurrence of temperature variations resulting from a pit.

[3] A cooling plate according to the present invention (the cooling plate according to [1] or [2]) preferably contains 0.1% to 0.5% by mass of $SiO_2$. This can relatively increase four-point bending strength, which is one of material properties.

[4] A cooling plate according to the present invention (the cooling plate according to any one of [1] to [3]) preferably has a mass ratio $SiC/TiSi_2$ in the range of 0.47 to 0.98 and a mass ratio SiC/TiC in the range of 2.7 to 8.8.

[5] A cooling plate according to the present invention (the cooling plate according to any one of [1] to [4]) may be used to cool an alumina substrate, and may have a difference of 0.5 ppm/K or less in average linear thermal expansion coefficient at 40° C. to 570° C. from alumina, or may have an average linear thermal expansion coefficient in the range of 7.2 to 9.0 ppm/K at 40° C. to 570° C. Thus, when a joined body of a cooling plate and an alumina substrate to be cooled is manufactured, due to the small thermal expansion difference between the cooling plate and the alumina substrate, even if the joined body of the cooling plate and the alumina substrate is repeatedly used between a low temperature and a high temperature, the cooling plate is less likely to separate from the alumina substrate.

A cooling plate according to the present invention (the cooling plate according to any one of [1] to [5]) preferably has an opening ratio of 1% or less, more preferably 0.1% or less. The cooling plate preferably has a bulk density of 3.70 $g/cm^3$ or more, preferably 3.74 $g/cm^3$ or more. The cooling plate preferably has a thermal conductivity of 75 W/mK or more, more preferably 80 W/mK or more. The cooling plate preferably has a four-point bending strength of 250 MPa or more, more preferably 290 MPa or more. The cooling plate preferably has a SiC content in the range of 30% to 44% by mass.

[6] A member for a semiconductor manufacturing apparatus according to the present invention includes an alumina substrate having an electrode therein, a cooling plate according to the present invention (the cooling plate according to [5]), and a metal bonding layer for bonding the alumina substrate and the cooling plate. The member for a semiconductor manufacturing apparatus has a small thermal expansion difference between the cooling plate and the alumina substrate. Thus, even if the member for a semiconductor manufacturing apparatus is repeatedly used between a low temperature and a high temperature, the cooling plate is less likely to separate from the alumina substrate. Thus, the member for a semiconductor manufacturing apparatus has a longer life.

In the member for a semiconductor manufacturing apparatus according to the present invention (the member for a semiconductor manufacturing apparatus according to [6]), the metal bonding layer is preferably formed of an aluminum alloy containing Mg or containing Si and Mg.

BRIEF DESCRIPTION OF THE DRAWINGS

FIGS. 5A and 5B include explanatory views of a second substrate 32.

FIGS. 8A and 8B include explanatory views of a second substrate 132.

DETAILED DESCRIPTION OF THE INVENTION

[Member for Semiconductor Manufacturing Apparatus— First Embodiment]

Figure 1:
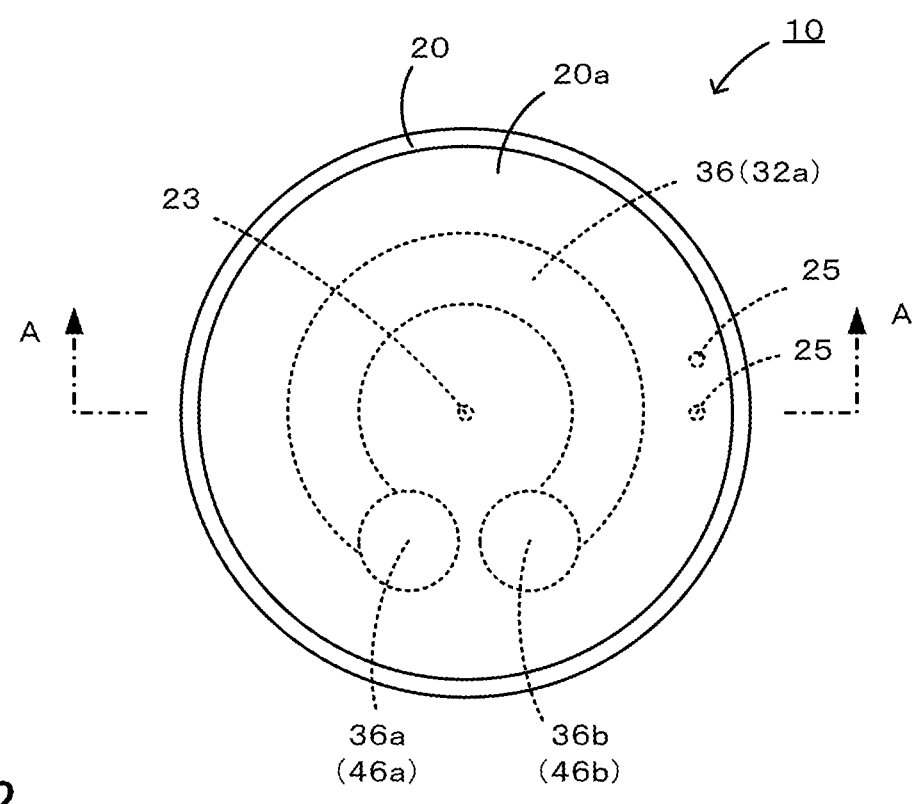
FIG. 1 is a plan view of a member 10 for a semiconductor manufacturing apparatus.
Figure 2:
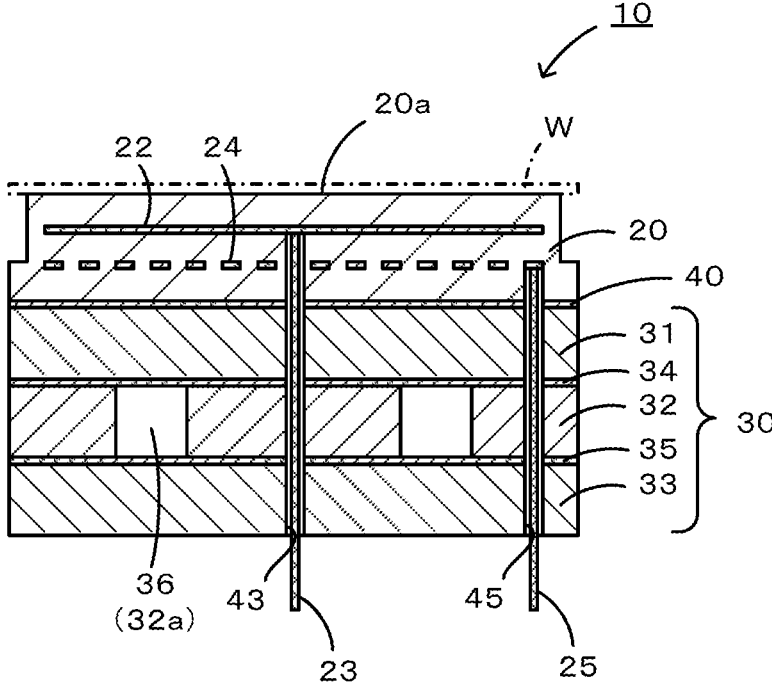
FIG. 2 is a cross-sectional view taken along the line A-A of FIG. 1.

A member 10 for a semiconductor manufacturing apparatus according to a first embodiment will be described below. FIG. 1 is a plan view of the member 10 for a semiconductor manufacturing apparatus, and FIG. 2 is a cross-sectional view taken along the line A-A of FIG. 1.

A member 10 for a semiconductor manufacturing apparatus includes an alumina electrostatic chuck 20 for adsorbing a silicon wafer W to be subjected to plasma treatment, a cooling plate stack 30 for cooling the electrostatic chuck 20, and a stack-chuck bonding layer 40 for bonding the electrostatic chuck 20 and the cooling plate stack 30.

The electrostatic chuck 20 is a disc-shaped alumina plate having an outer diameter smaller than the outer diameter of the wafer W and includes an electrostatic electrode 22 and a heater electrode 24. The electrostatic electrode 22 is a planar electrode to which a direct-current voltage can be applied from an external power supply (not shown) through a rod-like power supply terminal 23. When a direct-current voltage is applied to the electrostatic electrode 22, the wafer W is adsorbed and fixed to a wafer mounting face 20a by the action of Coulomb force. When the application of the direct-current voltage is terminated, the wafer W is released from the wafer mounting face 20a. The heater electrode 24 has a pattern, for example, of a single continuous line so as to realize electric wiring over the entire surface of the electrostatic chuck 20. Upon the application of a voltage, the heater electrode 24 generates heat and heats the wafer W. A voltage can be applied to the heater electrode 24 via a rod-like power supply terminal 25 extending from the back side of the cooling plate stack 30 to one end and the other end of the heater electrode 24.

The cooling plate stack 30 is a disk-shaped stack with an outer diameter slightly greater than or equal to the outer diameter of the electrostatic chuck 20 and includes a first substrate 31, a second substrate 32, a third substrate 33, a first metal bonding layer 34 between the first substrate 31 and the second substrate 32, a second metal bonding layer 35 between the second substrate 32 and the third substrate 33, and a refrigerant path 36 through which a refrigerant can flow. The second substrate 32 has a punched portion 32a. The punched portion 32a is formed by punching the second substrate 32 from one surface to the other surface of the second substrate 32 such that the punched portion 32a has the same shape as the refrigerant path 36. The first and second metal bonding layers 34 and 35 are formed by thermal compression bonding of the substrates 31 to 33 with a metal bonding material (for example, an Al—Si—Mg or Al—Mg metal bonding material) interposed between the first substrate 31 and one surface of the second substrate 32 and between the other surface of the second substrate 32 and the third substrate 33. The cooling plate stack 30 includes a refrigerant supply hole 46a and a refrigerant discharge hole 46b, which extend in a direction perpendicular to the wafer placement surface 20a from a surface opposite a surface to which the electrostatic chuck 20 is bonded. The refrigerant supply hole 46a and a refrigerant discharge hole 46b are connected to an inlet 36a and an outlet 36b, respectively, of the refrigerant path 36. The cooling plate stack 30 includes terminal insertion holes 43 and 45 passing through a surface to which the electrostatic chuck 20 is bonded and its opposite surface. The terminal insertion hole 43 is a hole into which the power supply terminal 23 of the electrostatic electrode 22 is inserted. The terminal insertion hole 45 is a hole into which the power supply terminal 25 of the heater electrode 24 is inserted.

A composite material cooling plate used for the first to third substrates 31 to 33 contains 42% to 65% by mass (preferably 42% to 53% by mass) of $TiSi_2$, 4% to 16% by mass (preferably 8% to 15% by mass) of TiC, and a smaller amount of SiC than the mass percentage of $TiSi_2$. The content is determined from an X-ray diffraction pattern of a composite material cooling plate by simple determination using data analysis software. The cooling plate has good material properties and has very few pits on its surface. In the present description, a "pit" is defined as a hole with a major axis of 0.5 mm or more through which a fluorescent liquid penetrates after a penetrant test using the fluorescent liquid on a surface of 30,000 $mm^2$ or more (for example, $\varphi$200 mm or more).

The stack-chuck bonding layer 40 is formed by thermal compression bonding of the first substrate 31 of the cooling plate stack 30 and the electrostatic chuck 20 with a metal bonding material (for example, an Al—Si—Mg or Al—Mg metal bonding material) interposed therebetween. The power supply terminals 23 and 25 are not in direct contact with the cooling plate stack 30, the first and second metal bonding layers 34 and 35, and the stack-chuck bonding layer 40.

The member 10 for a semiconductor manufacturing apparatus may include a gas supply hole for supplying He gas to the back side of the wafer W and a lift pin insertion hole into which a lift pin for lifting the wafer W from the wafer mounting face 20a is inserted. The gas supply hole and the lift pin insertion hole pass through the member 10 for a semiconductor manufacturing apparatus in a direction perpendicular to the wafer mounting face 20a.

A usage example of the member 10 for a semiconductor manufacturing apparatus will be described below. First, a wafer W is placed on the wafer mounting face 20a of the member 10 for a semiconductor manufacturing apparatus in a vacuum chamber (not shown). The internal pressure of the vacuum chamber is then reduced with a vacuum pump to a predetermined degree of vacuum. A direct-current voltage is applied to the electrostatic electrode 22 to generate a Coulomb force, thereby adsorbing and fixing the wafer W to the wafer mounting face 20a. The vacuum chamber is then filled with a reactant gas at a predetermined pressure (for example, tens to hundreds of pascals), and a plasma is formed in the vacuum chamber. A surface of the wafer W is etched with the plasma. The electric power supplied to the heater electrode 24 is controlled with a controller (not shown) such that the wafer W has a target temperature.

Figures 5A, 5B:
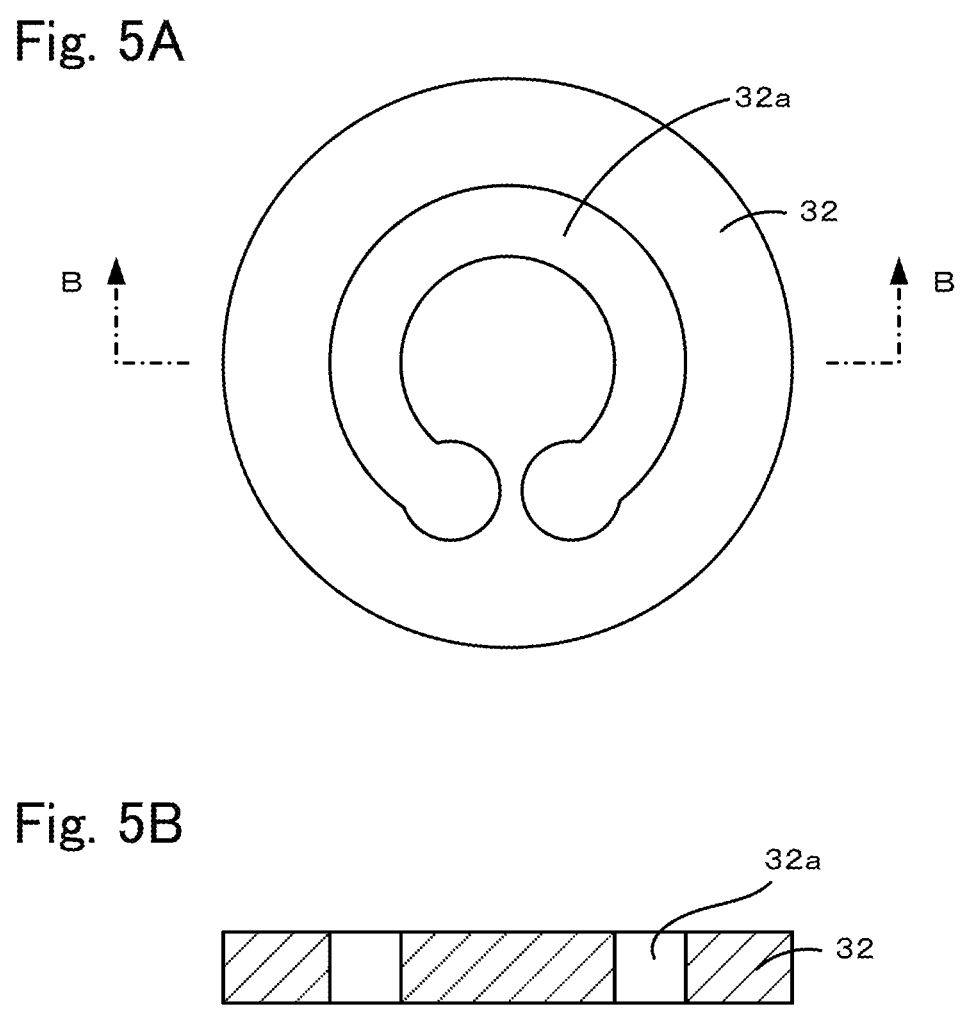

A manufacturing example of the member 10 for a semiconductor manufacturing apparatus will be described below. FIGS. 3A to 3E, 4A and 4B are manufacturing process drawings of the member 10 for a semiconductor manufacturing apparatus. FIGS. 5A and 5B include explanatory views of the second substrate 32. FIG. 5A is a plan view, and FIG. 5B is a cross-sectional view taken along the line B-B of FIG. 5A.

Figures 3A, 3B, 3C, 3D, 3E:
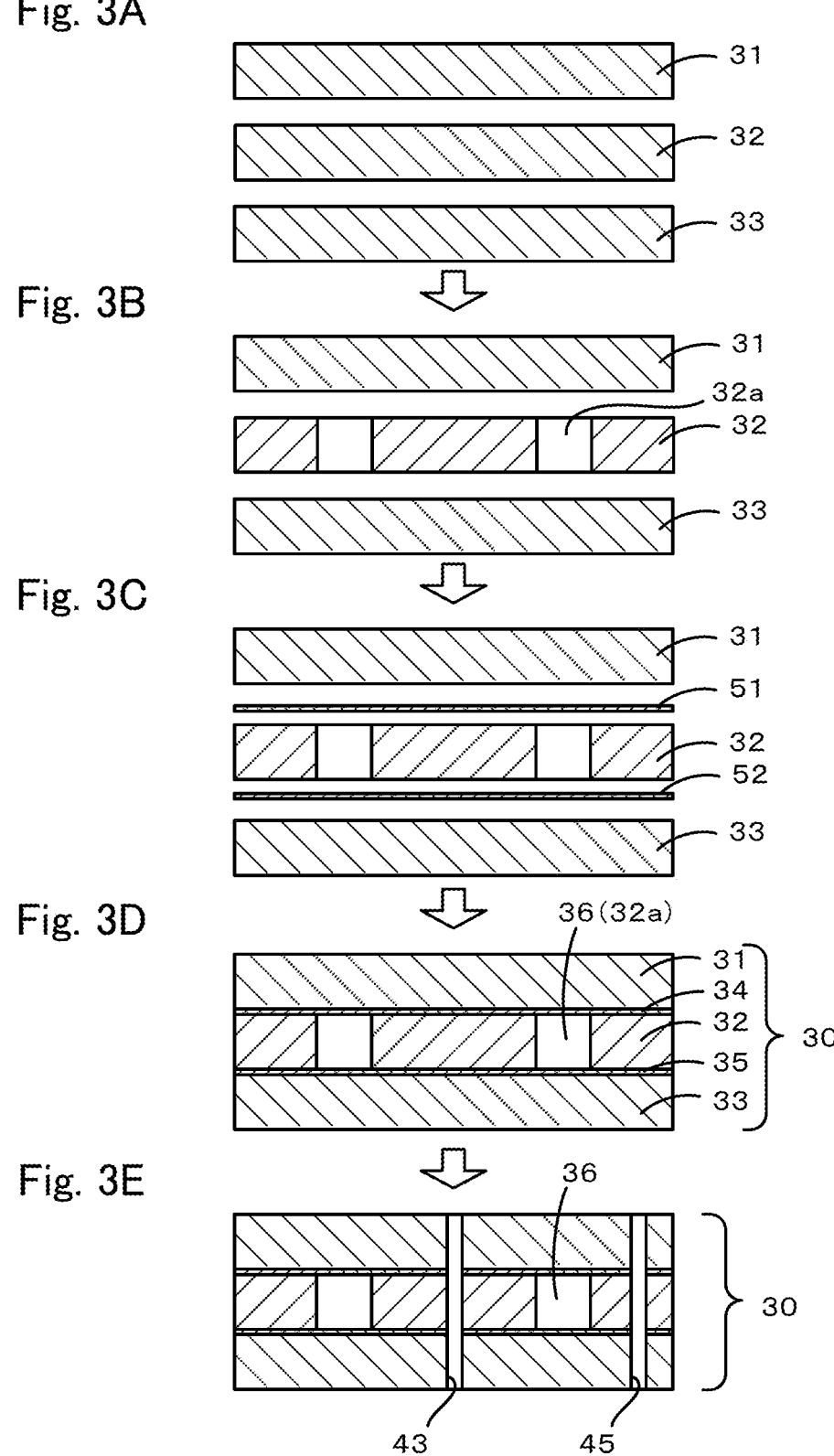
FIGS. 3A to 3E include manufacturing process drawings of the member 10 for a semiconductor manufacturing apparatus.
Figure 4A:
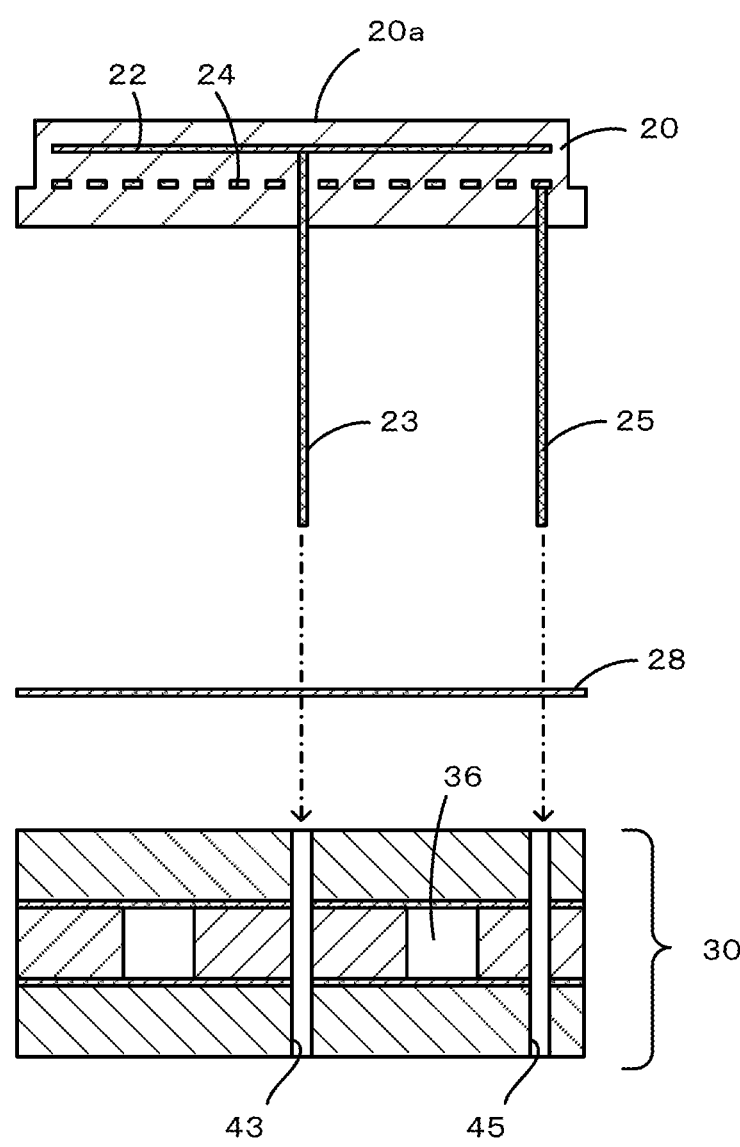
FIGS. 4A and 4B include manufacturing process drawings of the member 10 for a semiconductor manufacturing apparatus.
Figure 4B:
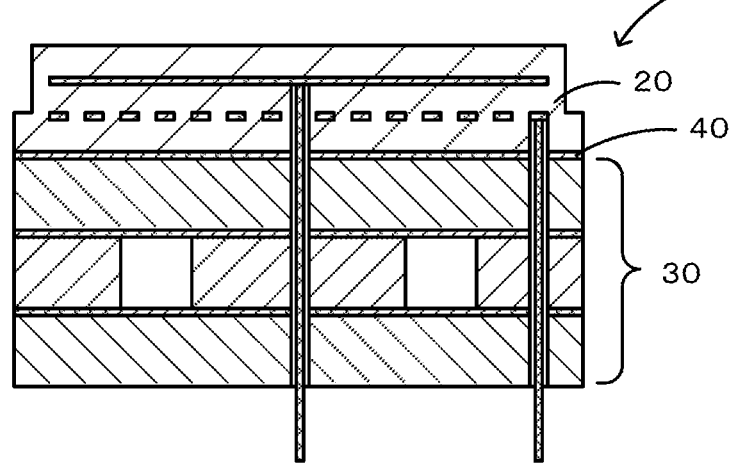

First, the first to third substrates 31 to 33, which are disk-shaped thin plates (cooling plates), are prepared (see FIG. 3A). The punched portion 32a is then formed in the second substrate 32 by punching the second substrate 32 from one surface to the other surface of the second substrate 32 such that the punched portion 32a has the same shape as the refrigerant path 36 (see FIG. 3B, FIGS. 5A and 5B). The punched portion 32a can be formed using a machining center, water jet, or electrical discharge machining. The first to third substrates 31 to 33 are then subjected to thermal compression bonding (see FIG. 3D) with a metal bonding material 51 interposed between the first substrate 31 and one surface of the second substrate 32 and a metal bonding material 52 interposed between the other surface of the second substrate 32 and the third substrate 33 (see FIG. 3C). In this way, the punched portion 32a becomes the refrigerant path 36, the first metal bonding layer 34 is formed between the first substrate 31 and the second substrate 32, and the second metal bonding layer 35 is formed between the second substrate 32 and the third substrate 33. Thus, the cooling plate stack 30 is completed. Each of the metal bonding materials 51 and 52 is preferably an Al—Si—Mg or Al—Mg bonding material. The thermal compression bonding (TCB) using these bonding materials is performed by pressing the substrates at a pressure in the range of 0.5 to 2.0 kg/mm$^2$ for 1 to 5 hours in a vacuum atmosphere at a temperature less than or equal to the solidus temperature. The refrigerant supply hole 46a and the refrigerant discharge hole 46b are then formed. The refrigerant supply hole 46a extends from the back side of the cooling plate stack 30 to the inlet 36a of the refrigerant path 36. The refrigerant discharge hole 46b extends from the back side of the cooling plate stack 30 to the outlet 36b of the refrigerant path 36. The terminal insertion holes 43 and 45 passing through the front and back sides of the cooling plate stack 30 are also formed (see FIG. 3E; the inlet 36a and the outlet 36b of the refrigerant path 36, the refrigerant supply hole 46a, and the refrigerant discharge hole 46b are not shown in FIG. 3E but shown in FIG. 1).

The electrostatic chuck 20 is separately manufactured. The electrostatic chuck 20 includes the electrostatic electrode 22 and the heater electrode 24 buried therein and the power supply terminals 23 and 25 (see FIG. 4A). The electrostatic chuck 20 can be prepared as described in Japanese Unexamined Patent Application Publication No. 2006-196864. The electrostatic chuck 20 and the cooling plate stack 30 are subjected to thermal compression bonding with a metal bonding material 28 interposed between a surface opposite the wafer mounting face 20a of the electrostatic chuck 20 and a surface of the first substrate 31 of the cooling plate stack 30 while the power supply terminals 23 and 25 are inserted into the terminal insertion holes 43 and 45 (see FIG. 4A). As a result, the stack-chuck bonding layer 40 is formed between the electrostatic chuck 20 and the cooling plate stack 30, thus completing the member 10 for a semiconductor manufacturing apparatus (see FIG. 4B). Preferably, TCB is performed using an Al—Si—Mg or Al—Mg bonding material as the metal bonding material 28, as described above.

A cooling plate used for each of the first to third substrates 31 to 33 of the first embodiment described in detail above has good material properties and therefore has a high ability to cool an object. Furthermore, the cooling plate has fewer pits on its surface, can reduce the occurrence of breakage starting from a pit, and can reduce the occurrence of temperature variations due to a decrease in heat conduction around a pit.

The cooling plate preferably contains 0.1% to 0.5% by mass of SiO$_2$. This can relatively increase four-point bending strength, which is one of material properties. The cooling plate preferably has a mass ratio SiC/TiSi$_2$ in the range of 0.47 to 0.98. The cooling plate preferably has a mass ratio SiC/TiC in the range of 2.7 to 8.8. The cooling plate preferably has a SiC content in the range of 30% to 44% by mass.

The cooling plate preferably has a difference of 0.5 ppm/K or less in average linear thermal expansion coefficient at 40° C. to 570° C. from alumina, or has an average linear thermal expansion coefficient in the range of 7.2 to 9.0 ppm/K at 40° C. to 570° C. A joined body of an alumina substrate serving as the electrostatic chuck 20 and a cooling plate serving as the first substrate 31 has a small thermal expansion difference between the alumina substrate and the cooling plate. Thus, even if the joined body is repeatedly used between a low temperature and a high temperature, the cooling plate is less likely to separate from the alumina substrate. Thus, the member 10 for a semiconductor manufacturing apparatus has a longer life.

The cooling plate preferably has an opening ratio of 1% or less, more preferably 0.1% or less, and a bulk density of 3.70 g/cm$^3$ or more, preferably 3.74 g/cm$^3$ or more. In such a case, the cooling plate has sufficiently high denseness and consequently high liquid tightness and air tightness. The cooling plate preferably has a thermal conductivity of 75 W/mK or more, more preferably 80 W/mK or more. In such a case, the cooling plate can efficiently absorb heat from the electrostatic chuck 20 to be cooled. The cooling plate preferably has a four-point bending strength of 250 MPa or more, more preferably 290 MPa or more. In such a case, the cooling plate can withstand processing and bonding at the time of manufacturing the member 10 for a semiconductor manufacturing apparatus and can also sufficiently withstand the stress caused by the temperature change during use. The cooling plate may contain 9% to 16% by mass of a C element, 0.1% to 0.5% by mass of Si$_3$N$_4$, and 0.1% to 0.5% by mass of TiN.

[Member for Semiconductor Manufacturing Apparatus—Second Embodiment]

Figure 6:
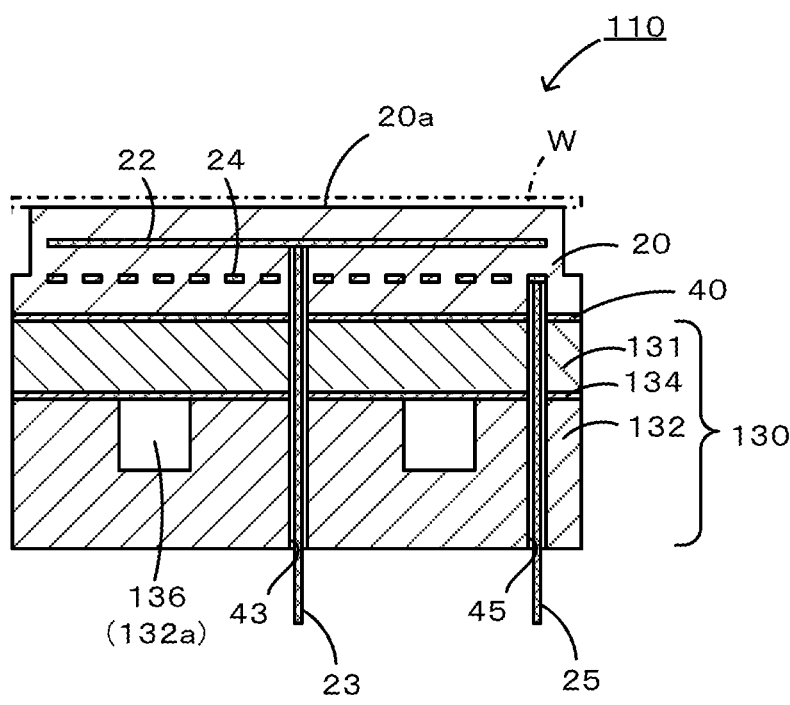
FIG. 6 is a cross-sectional view of a member 110 for a semiconductor manufacturing apparatus.
Figures 7A, 7B, 7C, 7D:
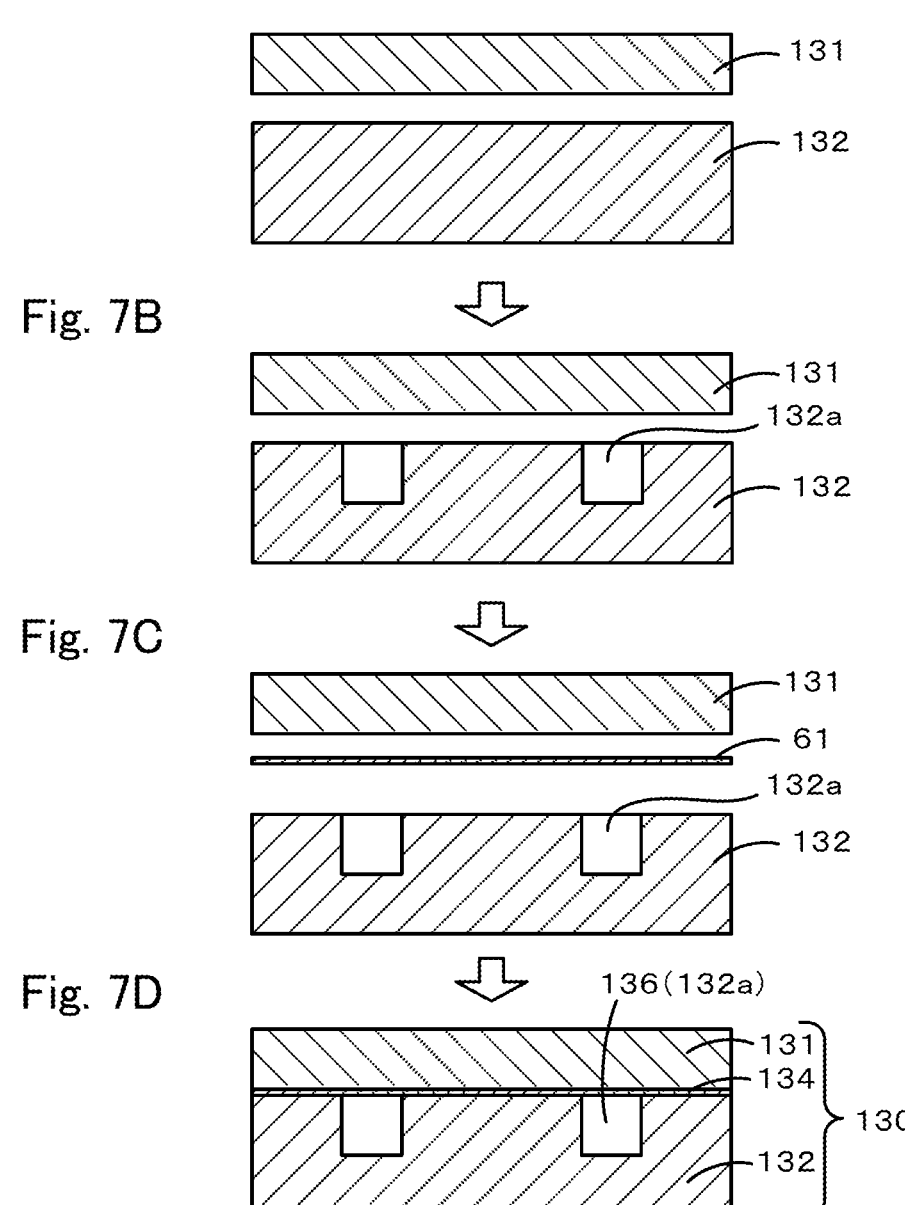
FIGS. 7A to 7D include manufacturing process drawings of the member 110 for a semiconductor manufacturing apparatus.

A member 110 for a semiconductor manufacturing apparatus according to a second embodiment will be described below. FIG. 6 is a cross-sectional view of the member 110 for a semiconductor manufacturing apparatus.

The member 110 for a semiconductor manufacturing apparatus includes an alumina electrostatic chuck 20 for adsorbing a silicon wafer W to be subjected to plasma treatment, a cooling plate stack 130 for cooling the electrostatic chuck 20, and a stack-chuck bonding layer 40 for bonding the cooling plate stack 130 and the electrostatic chuck 20.

The electrostatic chuck 20 is the same as in the first embodiment, has the same reference numerals as in the first embodiment, and is not further described. The cooling plate stack 130 is a disk-shaped stack with an outer diameter slightly greater than or equal to the outer diameter of the electrostatic chuck 20 and includes a first substrate 131, a second substrate 132, a metal bonding layer 134 between the first substrate 131 and the second substrate 132, and a refrigerant path 136 through which a refrigerant can flow. A composite material cooling plate used for each of the first and second substrates 131 and 132 is basically the same as the cooling plate used in the first embodiment. The second substrate 132 has a groove 132a for the refrigerant path 136 in a surface thereof facing the first substrate 131. The metal bonding layer 134 is formed by thermal compression bonding of the first substrate 131 and the second substrate 132 with a metal bonding material (for example, an Al—Si—Mg or Al—Mg metal bonding material) interposed between the first substrate 131 and a surface of the second substrate 132 in which the groove 132a is formed. As in the first embodiment, the cooling plate stack 130 includes a refrigerant supply hole (not shown) and a refrigerant discharge hole (not shown) connected to an inlet and an outlet, respectively, of the refrigerant path 136. As in the first embodiment, the cooling plate stack 130 has terminal insertion holes 43 and 45. The stack-chuck bonding layer 40 is the same as in the first embodiment and is not described here.

A usage example of the member 110 for a semiconductor manufacturing apparatus is almost the same as in the first embodiment and is not described here.

Figures 8A, 8B:
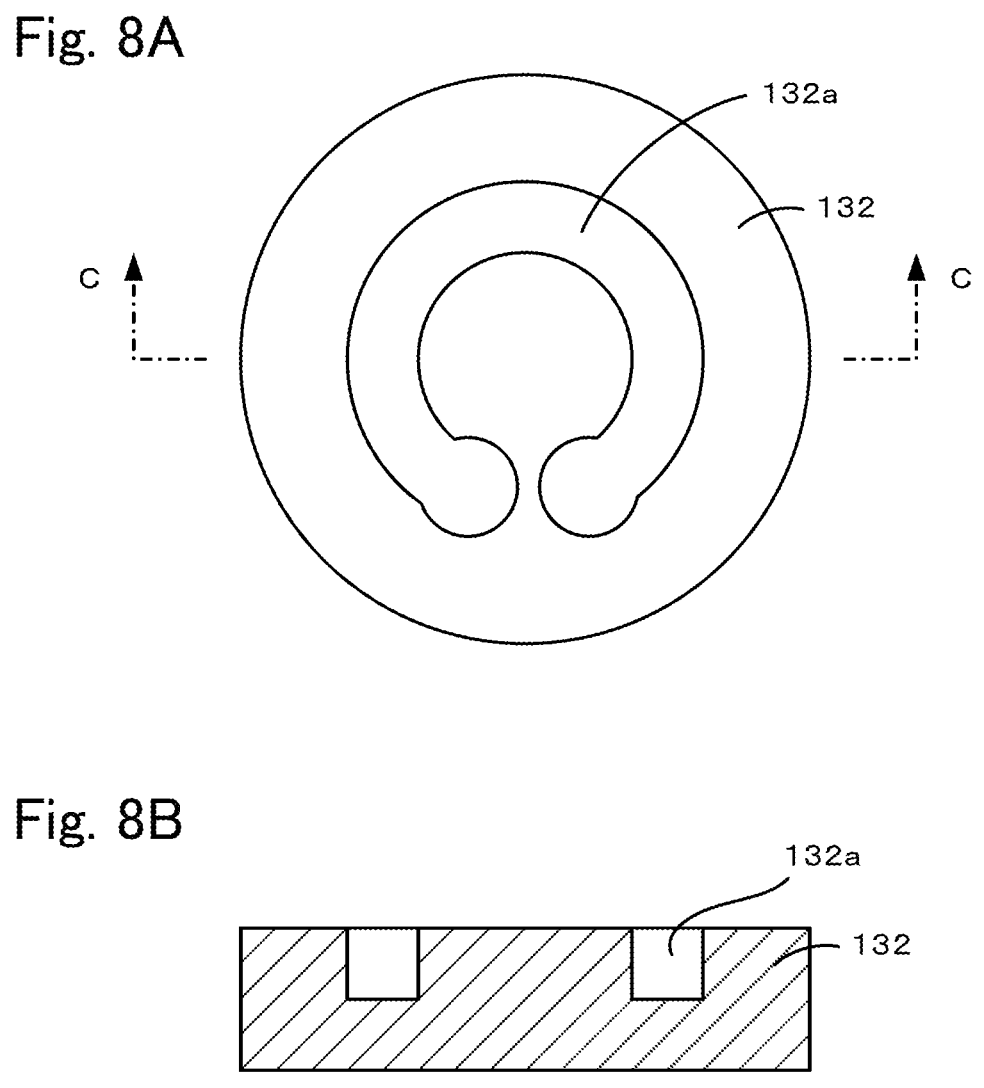

A manufacturing example of the member 110 for a semiconductor manufacturing apparatus is described below. FIGS. 7A to 7D include manufacturing process drawings of the member 110 for a semiconductor manufacturing apparatus. FIGS. 8A and 8B include explanatory views of a second substrate 132. FIG. 8A is a plan view, and FIG. 8B is a cross-sectional view taken along the line C-C of FIG. 8A. First, the first and second substrates 131 and 132, which are disk-shaped thin plates (cooling plates), are prepared (see FIG. 7A). The groove 132a for the refrigerant path 136 is then formed in a surface of the second substrate 132 facing the first substrate 131 (see FIG. 7B, FIGS. 8A and 8B). The groove 132a can be formed using a machining center, water jet, or electrical discharge machining. The first and second substrates 131 and 132 are then subjected to thermal compression bonding (see FIG. 7D) with a metal bonding material 61 interposed between the first substrate 131 and a surface of the second substrate 132 in which the groove 132a is formed (see FIG. 7C). In this way, the groove 132a becomes the refrigerant path 136, and the metal bonding layer 134 is formed between the first substrate 131 and the second substrate 132. Thus, the cooling plate stack 130 is completed. At this time, TCB is preferably performed using an Al—Si—Mg or Al—Mg bonding material as the metal bonding material 61, as described above. The subsequent process, that is, a process of bonding the electrostatic chuck 20 and the cooling plate stack 130 is the same as in the first embodiment and is not further described.

The cooling plates used in the first and second substrates 131 and 132 of the second embodiment described in detail above are the same as those used in the first embodiment and have the same effects as in the first embodiment.

[Member for Semiconductor Manufacturing Apparatus—Third Embodiment]

Figure 9:
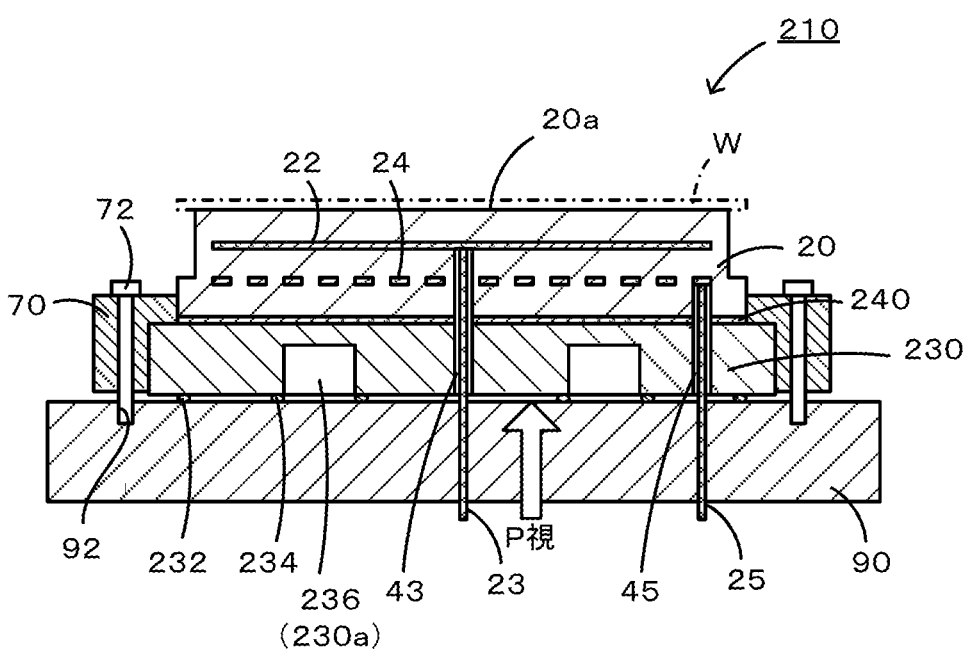
FIG. 9 is a cross-sectional view of a member 210 for a semiconductor manufacturing apparatus.
Figure 10:
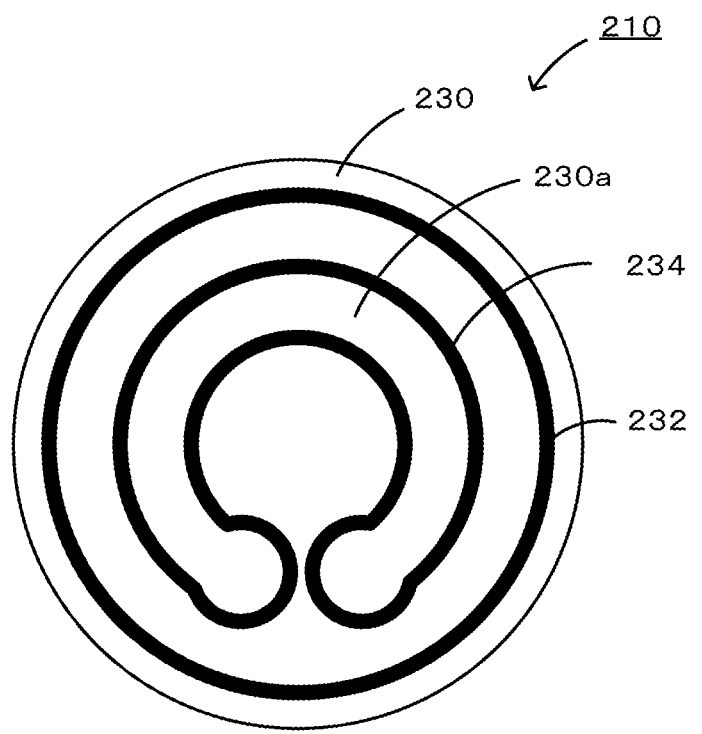
FIG. 10 is a rear view (P view) of the member 210 for a semiconductor manufacturing apparatus.

A member 210 for a semiconductor manufacturing apparatus according to a third embodiment is described below. FIG. 9 is a cross-sectional view of the member 210 for a semiconductor manufacturing apparatus. FIG. 10 is a rear view (P view) of the member 210 for a semiconductor manufacturing apparatus.

The member 210 for a semiconductor manufacturing apparatus includes an alumina electrostatic chuck 20 for adsorbing a silicon wafer W to be subjected to plasma treatment, a cooling plate 230 for cooling the electrostatic chuck 20, and a cooling plate-chuck bonding layer 240 for bonding the cooling plate 230 and the electrostatic chuck 20.

The electrostatic chuck 20 is the same as in the first embodiment, has the same reference numerals as in the first embodiment, and is not further described. The cooling plate 230 is a disk-shaped single-layer plate with an outer diameter slightly greater than or equal to the outer diameter of the electrostatic chuck 20 and is basically the same as the cooling plate used in the first embodiment. The cooling plate 230 has a refrigerant path groove 230a on a surface facing a mounting plate 90 on the vacuum chamber side. The refrigerant path groove 230a has the same shape as the groove 132a in FIGS. 8A and 8B. As in the first embodiment, the cooling plate 230 has terminal insertion holes 43 and 45. The cooling plate-chuck bonding layer 240 is the same as the stack-chuck bonding layer 40 in the first embodiment and is not described here.

An outer peripheral sealing member 232 is an elastically deformable resin or metallic ring and is located along the outer peripheral edge of the lower surface of the cooling plate 230 (see FIG. 10). A refrigerant path sealing member 234 is an elastically deformable resin or metallic member and surrounds the refrigerant path groove 230a (see FIG. 10). The outer peripheral sealing member 232 and the refrigerant path sealing member 234 are located between the upper surface of the mounting plate 90 and the lower surface of the member 210 for a semiconductor manufacturing apparatus (the lower surface of the cooling plate 230).

The member 210 for a semiconductor manufacturing apparatus is attached to the mounting plate 90 using a clamp member 70. The clamp member 70 is an annular member with an approximately inverted L-shaped cross section. An inner peripheral stepped surface of the clamp member 70 is hooked on an outer peripheral upper surface of the cooling plate 230, and a bolt 72 is inserted from the upper surface of the clamp member 70 and is screwed into a tapped hole 92 of the mounting plate 90. The bolts 72 are tightened at a plurality of positions (for example, eight or twelve positions) at regular intervals along the circumference of the clamp member 70. The outer peripheral sealing member 232 and the refrigerant path sealing member 234 are vertically pressed by the bolts 72 screwed into the tapped holes 92 and exhibit sealing performance. Thus, the refrigerant path groove 230a is closed at the lower opening thereof by the mounting plate 90 and forms a refrigerant path 236. The mounting plate 90 includes a refrigerant supply hole (not shown) and a refrigerant discharge hole (not shown) connected to an inlet and an outlet, respectively, of the refrigerant path 236.

A usage example of the member 210 for a semiconductor manufacturing apparatus is almost the same as in the first embodiment and is not described here. A manufacturing example of the member 210 for a semiconductor manufacturing apparatus is also not described here because the member 210 for a semiconductor manufacturing apparatus can be manufactured by using the second substrate 132 of the second embodiment as the cooling plate 230.

The cooling plate 230 of the third embodiment described in detail above is the same as the cooling plate used in the first embodiment and therefore has the same effects as in the first embodiment.

It goes without saying that the present invention should not be limited to these embodiments and can be implemented in various aspects within the technical scope of the present invention.

For example, a cooling plate according to the present invention is not limited to the structures of the first to third substrates 31 to 33 of the first embodiment, the first substrate 131 and the second substrate 132 of the second embodiment, and the cooling plate 230 of the third embodiment, and may have any structure. The first and third substrates 31 and 33 and the first substrate 131 are examples of structures with no refrigerant path groove, and the second substrates 32 and 132 and the cooling plate 230 are examples of structures with a refrigerant path groove. A cooling plate according to the present invention may or may not have a refrigerant path groove (or a refrigerant path). The shape of the refrigerant paths 36, 136, and 236 is not limited to the shape of the above embodiments. Furthermore, although the cooling plate stack 30 of the first embodiment has a three-layer structure, the cooling plate stack 130 of the second embodiment has a two-layer structure, and the cooling plate 230 of the third embodiment has a single-layer structure, the number of layers is not particularly limited to these. The cooling plate stacks 30 and 130 and the cooling plate 230 may have no cooling path. In such a case, a substrate made of another material (for example, Al) may be provided below the cooling plate stack 30 or 130 or the cooling plate 230 and may have a refrigerant path or a refrigerant path groove.

EXAMPLES

Preferred examples of a cooling plate are described below.

1. Manufacturing Procedures

Preparation

Raw material components were weighed in the mass percentages listed in Table 1 and were wet-mixed for 4 hours in a nylon pot using isopropyl alcohol as a solvent and using an iron-core nylon ball with a diameter of 10 mm. After mixing, the resulting slurry was removed and was dried in a nitrogen stream at 110° C. The product was passed through a 30-mesh sieve to prepare a mixed powder. It was confirmed that mixing approximately 500 g of the weighed raw materials in a high-speed fluidizing mixer (the capacity of a powder charging unit was 1.8 L) while impeller blades were rotated at 1500 rpm resulted in the same material properties as the wet mixing.

Forming

The mixed powder was uniaxially pressed at a pressure of 200 kgf/cm² to form a disk-shaped compact. The disk-shaped compact was placed in a graphite mold for firing.

Firing

The disk-shaped compact was subjected to hot-press firing to prepare a dense cooling plate. The hot-press firing was performed at a pressing pressure of 200 kgf/cm² at a firing temperature (maximum temperature) listed in Table 1 in a vacuum atmosphere to the completion of firing. The holding time at the firing temperature was four hours. The resulting cooling plate had a diameter of 400 mm and a thickness of 25 mm.

2. Experimental Examples

Table 1 shows a: the starting material composition (% by mass) in experimental examples, b: hot-press firing temperature, c: constituent phases of a cooling plate and their contents (% by mass) determined from XRD measurement results, d: two mass ratios ($SiC/TiSi_2$ and $SiC/TiC$) in the cooling plate, e: material properties of the cooling plate (open porosity, bulk density, four-point bending strength, linear thermal expansion coefficient, thermal conductivity), and f: product characteristics of the cooling plate (number of pits). Of the experimental examples 1 to 24, experimental examples 1 to 16 correspond to examples of the present invention, and the other examples correspond to comparative examples.

TABLE 1

| Experimental Example No. | a Material Composition: % by mass | | | | | | b Firing Temperature (° C.) | c Constituent Phase | | | | | |
|---|---|---|---|---|---|---|---|---|---|---|---|---|---|
| | SiC | Si | Ti | $TiSi_2$ | TiC | $SiO_2$ | | SiC | $TiSi_2$ | TSC | TiC | $SiO_2$ | Total |
| 1 | 34.7 | — | — | 52.7 | 12.6 | — | 1330 | 41.8 | 46.6 | — | 11.3 | 0.3 | 100 |
| 2 | 34.7 | — | — | 52.7 | 12.6 | — | 1345 | 41.1 | 47.3 | — | 11.3 | 0.3 | 100 |
| 3 | 34.7 | — | — | 52.7 | 12.6 | — | 1360 | 41.3 | 47.2 | — | 11.2 | 0.3 | 100 |
| 4 | 34.7 | — | — | 52.7 | 12.6 | — | 1370 | 41.5 | 46.8 | — | 11.4 | 0.3 | 100 |
| 5 | 34.7 | — | — | 52.7 | 12.6 | — | 1390 | 41.3 | 47.1 | — | 11.3 | 0.3 | 100 |
| 6 | 34.7 | — | — | 52.7 | 12.6 | — | 1420 | 41.0 | 47.5 | — | 11.2 | 0.3 | 100 |
| 7 | 38.2 | — | — | 52.7 | 9.1 | — | 1390 | 43.9 | 47.3 | — | 8.5 | 0.3 | 100 |
| 8 | 35.2 | — | — | 59.5 | 5.3 | — | 1390 | 41.8 | 53.0 | — | 4.9 | 0.3 | 100 |
| 9 | 35.2 | — | — | 59.5 | 5.3 | — | 1420 | 42.0 | 52.9 | — | 4.8 | 0.3 | 100 |
| 10 | 39.6 | — | — | 44.4 | 16.0 | — | 1330 | 41.6 | 42.7 | — | 15.4 | 0.3 | 100 |
| 11 | 39.6 | — | — | 44.4 | 16.0 | — | 1390 | 41.8 | 42.7 | — | 15.2 | 0.3 | 100 |
| 12 | 34.4 | — | — | 52.7 | 12.6 | 0.3 | 1390 | 41.0 | 47.2 | — | 11.3 | 0.5 | 100 |
| 13 | 34.7 | — | — | 52.7 | 12.6 | — | 1390 | 42.3 | 46.5 | — | 11.1 | 0.1 | 100 |
| 14 | 34.2 | — | — | 52.7 | 12.6 | 0.5 | 1390 | 41.2 | 47.9 | — | 10.2 | 0.7 | 100 |
| 15 | 34.3 | — | — | 54.2 | 11.5 | — | 1390 | 39.9 | 49.0 | — | 10.8 | 0.3 | 100 |
| 16 | 28.0 | — | — | 65.6 | 6.4 | — | 1390 | 30.1 | 64.6 | — | 5.0 | 0.3 | 100 |
| 17 | 37.1 | — | — | 60.4 | 2.5 | — | 1330 | 41.7 | 52.9 | 2.8 | 2.6 | — | 100 |
| 18 | 37.1 | — | — | 60.4 | 2.5 | — | 1390 | 41.6 | 53.3 | 3.2 | 1.9 | — | 100 |
| 19 | 17.5 | — | — | 72.4 | 10.1 | — | 1330 | 21.1 | 69.0 | — | 9.6 | 0.3 | 100 |
| 20 | 17.5 | — | — | 72.4 | 10.1 | — | 1390 | 21.0 | 68.9 | — | 9.8 | 0.3 | 100 |
| 21 | 17.5 | — | — | 72.4 | 10.1 | — | 1420 | 21.4 | 67.9 | — | 10.4 | 0.3 | 100 |
| 22 | 47.3 | — | — | 40.2 | 12.5 | — | 1390 | 48.5 | 38.6 | — | 12.7 | 0.2 | 100 |
| 23 | 42.7 | 22.7 | 34.6 | — | — | — | 1390 | 41.5 | 53.4 | 3.2 | 1.9 | — | 100 |
| 24 | 44.8 | 16.4 | 38.7 | — | — | — | 1390 | 43.1 | 32.4 | 22.4 | 2.1 | — | 100 |

TABLE 1-continued

| | | | | | | e | | |
|---|---|---|---|---|---|---|---|---|
| | | | | | | Material Property | | |
| | d | | Open | Bulk | Four-point Bending | Linear Thermal Expansion | Thermal | f Product |
| Experimental | Mass Ratio | | Porosity | Density | Strength | Coefficient | Conductivity | Characteristic |
| Example No. | SiC/TiSi$_2$ | SiC/TiC | (%) | (g/cm$^3$) | (Mpa) | (ppm/K) | (W/mK) | Number of Pits |
| 1 | 0.90 | 3.7 | 0.0 | 3.74 | 317 | 7.7 | 85 | 0 |
| 2 | 0.87 | 3.6 | 0.0 | 3.76 | 316 | 7.7 | 85 | 0 |
| 3 | 0.88 | 3.7 | 0.0 | 3.76 | 319 | 7.7 | 85 | 0 |
| 4 | 0.89 | 3.6 | 0.0 | 3.76 | 320 | 7.7 | 87 | 0 |
| 5 | 0.88 | 3.7 | 0.0 | 3.76 | 317 | 7.7 | 87 | 0 |
| 6 | 0.86 | 3.7 | 0.0 | 3.76 | 319 | 7.7 | 87 | 1 |
| 7 | 0.93 | 5.2 | 0.0 | 3.76 | 317 | 7.7 | 89 | 0 |
| 8 | 0.79 | 8.5 | 0.0 | 3.76 | 318 | 7.7 | 88 | 0 |
| 9 | 0.79 | 8.8 | 0.0 | 3.76 | 319 | 7.7 | 88 | 0 |
| 10 | 0.97 | 2.7 | 0.0 | 3.76 | 311 | 7.7 | 80 | 0 |
| 11 | 0.98 | 2.8 | 0.1 | 3.76 | 309 | 7.7 | 80 | 0 |
| 12 | 0.87 | 3.6 | 0.1 | 3.76 | 301 | 7.7 | 80 | 0 |
| 13 | 0.91 | 3.8 | 0.0 | 3.77 | 323 | 7.6 | 87 | 0 |
| 14 | 0.86 | 4.0 | 0.0 | 3.71 | 284 | 7.7 | 82 | 0 |
| 15 | 0.81 | 3.7 | 0.0 | 3.76 | 318 | 7.7 | 85 | 0 |
| 16 | 0.47 | 6.0 | 0.0 | 3.88 | 290 | 8.8 | 80 | 0 |
| 17 | 0.79 | 16.0 | 1.8 | 3.57 | 284 | 7.9 | 82 | 6 |
| 18 | 0.78 | 21.9 | 2.2 | 3.56 | 281 | 7.9 | 82 | 11 |
| 19 | 0.31 | 2.2 | 1.8 | 3.77 | 284 | 8.9 | 82 | 6 |
| 20 | 0.30 | 2.1 | 2.2 | 3.76 | 281 | 9.1 | 82 | 11 |
| 21 | 0.32 | 2.1 | 3.0 | 3.73 | 291 | 8.8 | 74 | 7 |
| 22 | 1.26 | 3.8 | 1.9 | 3.60 | 293 | 7.6 | 81 | 5 |
| 23 | 0.78 | 21.8 | 0.0 | 3.77 | 311 | 7.6 | 90 | 12 |
| 24 | 1.33 | 20.5 | 0.0 | 3.83 | 296 | 7.7 | 79 | 9 |

3. Simple Determination of Constituent Phase

A cooling plate was ground in a mortar, and a crystalline phase was identified with an X-ray diffractometer. The measurement conditions included CuKα, 40 kV, 40 mA, and 2θ=5 to 70 degrees. A sealed-tube X-ray diffractometer (D8 Advance manufactured by Bruker AXS K.K.) was used. The simple determination of constituent phases was performed. The simple determination determined the crystalline phase content of the cooling plate on the basis of X-ray diffraction peaks. The SiC, TiSi$_2$, TSC (Ti$_3$SiC$_2$), TiC, and SiO$_2$ contents were determined in the simple determination. A simplified profile fitting function (FPM Eval.) of powder diffraction data analysis software "EVA" available from Bruker AXS K.K. was used for the simple determination. This function calculates the quantitative ratio of constituent phases using I/Icor (an intensity ratio relative to the diffraction intensity of corundum) of an ICDD PDF card of an identified crystalline phase. The PDF card number of each crystalline phase was SiC: 00-049-1428, TiSi$_2$: 01-071-0187, TSC: 01-070-6397, TiC: 01-070-9258 (TiC0.62), and SiO$_2$: 00-039-1425.

4. Measurement of Material Properties

(1) Open Porosity and Bulk Density

The measurement was performed in accordance with Archimedes' principle using pure water as a medium.

(2) Four-Point Bending Strength

The measurement was performed in accordance with JIS-R1601.

(3) Linear Thermal Expansion Coefficient (Average Linear Thermal Expansion Coefficient at 40° C. to 570° C.)

A sample was heated twice to 650° C. at a heating rate of 20° C./min with TD5020S (a horizontal differential expansion measurement mode) manufactured by Bruker AXS K.K. in an argon atmosphere. The average linear thermal expansion coefficient in the temperature range of 40° C. to 570° C. was determined from the second measured data. An alumina standard sample attached to the apparatus (a purity of 99.7%, a bulk density of 3.9 g/cm$^3$, and a length of 20 mm) was used as a standard sample. Another alumina standard sample was prepared. The linear thermal expansion coefficient of the other alumina standard sample measured under the same conditions was 7.7 ppm/K.

(4) Thermal Conductivity

The measurement was performed using a laser flash method.

5. Measurement of Product Characteristics (Number of Pits)

The surface (30,000 mm$^2$ or more) of the resulting cooling plate with a diameter of 400 mm was subjected to a penetrant test using a fluorescent liquid. The number of holes (pits) with a major axis of 0.5 mm or more that the fluorescent liquid penetrated was visually counted under ultraviolet radiation.

6. Results

(1) Experimental Examples 1 to 16

In the experimental examples 1 to 16, SiC, TiSi$_2$, and TiC were used as raw materials (SiO$_2$ was further used in the experimental examples 12 and 14) and were subjected to hot-press firing at a firing temperature in the range of 1330° C. to 1420° C. to prepare cooling plates. The cooling plates had appropriate constituent phase contents and therefore had good material properties and product characteristics. The cooling plates of the experimental examples 1 to 16 had good material properties and therefore have a high ability to cool an object. In particular, the cooling plates of the experimental examples 1 to 16 had the same linear thermal expansion coefficient as alumina. Thus, even if joined bodies formed by metal-bonding the cooling plates and alumina are repeatedly used between a low temperature and a high temperature, the cooling plates are less likely to separate from the alumina. Furthermore, because the number of pits, which is a product characteristic, was zero or one, this can reduce the occurrence of breakage starting from a pit and the occurrence of temperature variations due to a decrease in heat conduction around a pit. The experimental example 14 had no pit but had a slightly high constituent phase $SiO_2$ content of 0.7% by mass and therefore had slightly lower four-point bending strength than the experimental examples 1 to 13, 15, and 16.

In the experimental examples 1 to 16, metal Si or metal Ti, which has high reactivity with water, was not used as a raw material, and it is therefore easy to control the manufacturing process of the cooling plates.

(2) Experimental Examples 17 to 24

The cooling plates of the experimental examples 17 to 24 did not have appropriate constituent phase contents and therefore tended to have poorer material properties than the experimental examples 1 to 16. Furthermore, these cooling plates had five or more pits as a product characteristic and therefore tended to be broken from a pit and also tended to have temperature variations due to a decrease in heat conduction around a pit. Incidentally, the experimental examples 23 and 24 had an open porosity of zero but had many pits. This result shows that even if the open porosity was zero, the number of pits was not necessarily zero.

International Application No. PCT/JP2022/021267, filed on May 24, 2022, is incorporated herein by reference in its entirety.

What is claimed is:

1. A cooling plate comprising: 42% to 65% by mass of $TiSi_2$; 4% to 16% by mass of TiC; 0.1% to 0.5% by mass of $SiO_2$; and a smaller amount of SiC than the mass percentage of $TiSi_2$.

2. The cooling plate according to claim 1, wherein the cooling plate has a surface of 30,000 mm² or more, and when observed after a penetrant test using a fluorescent liquid on the surface, the surface has not more than one hole into which the fluorescent liquid has penetrated and that has a major axis of 0.5 mm or more.

3. The cooling plate according to claim 1, wherein the cooling plate has a mass ratio $SiC/TiSi_2$ in the range of 0.47 to 0.98 and a mass ratio SiC/TiC in the range of 2.7 to 8.8.

4. The cooling plate according to claim 1, wherein the cooling plate is used to cool an alumina substrate, and has a difference of 0.5 ppm/K or less in average linear thermal expansion coefficient at 40° C. to 570° C. from alumina, or has an average linear thermal expansion coefficient in the range of 7.2 to 9.0 ppm/K at 40° C. to 570° C.

5. A member for a semiconductor manufacturing apparatus, comprising:
an alumina substrate having an electrode therein;
the cooling plate according to claim 4; and
a metal bonding layer for bonding the alumina substrate and the cooling plate.

6. The cooling plate according to claim 1, wherein the cooling plate is substantially free of $Ti_3SiC_2$.

7. The cooling plate according to claim 1, wherein the SiC is from 30 to 44 mass %.

8. The cooling plate according to claim 1, wherein the open porosity of the cooling plate is 0.01% or less.

\* \* \* \* \*